United States Patent
Yen et al.

(10) Patent No.: US 9,799,529 B2
(45) Date of Patent: Oct. 24, 2017

(54) METHOD OF PLANARIZING A FILM LAYER

(71) Applicant: Taiwan Semiconductor Manufacturing Co., Ltd., Hsin-Chu (TW)

(72) Inventors: Yung-Sung Yen, New Taipei (TW); Ru-Gun Liu, Hsinchu County (TW); Wei-Liang Lin, Hsin-Chu (TW); Hsin-Chih Chen, Taipei County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/072,792

(22) Filed: Mar. 17, 2016

(65) Prior Publication Data
US 2017/0271169 A1  Sep. 21, 2017

(51) Int. Cl.
*H01L 21/3105* (2006.01)
*H01L 21/8234* (2006.01)

(52) U.S. Cl.
CPC ............ *H01L 21/31055* (2013.01); *H01L 21/823431* (2013.01); *H01L 21/823481* (2013.01)

(58) Field of Classification Search
None
See application file for complete search history.

(56) References Cited

U.S. PATENT DOCUMENTS

| | | | | |
|---|---|---|---|---|
| 4,836,885 A * | 6/1989 | Breiten | ............ | H01L 21/31055 204/192.37 |
| 5,272,117 A * | 12/1993 | Roth | ................. | H01L 21/76819 216/38 |
| 5,435,888 A * | 7/1995 | Kalnitsky | ......... | H01L 21/02126 216/18 |
| 6,444,581 B1 * | 9/2002 | Buschner | .......... | H01L 21/31053 257/E21.244 |
| 7,968,948 B2 * | 6/2011 | Eun | .................... | H01L 21/76229 257/374 |
| 8,039,179 B2 | 10/2011 | Shieh et al. | | |
| 8,202,681 B2 | 6/2012 | Lin et al. | | |
| 8,367,534 B2 * | 2/2013 | Chen | ................. | H01L 21/28123 438/430 |
| 8,728,332 B2 | 5/2014 | Lin et al. | | |
| 8,822,243 B2 | 9/2014 | Yan et al. | | |
| 8,828,875 B1 * | 9/2014 | Lu | ....................... | H01L 21/7684 438/690 |
| 9,087,796 B2 * | 7/2015 | Adam | ................. | H01L 21/3212 |
| 2006/0091468 A1 | 5/2006 | Liaw | | |

(Continued)

*Primary Examiner* — Andres Munoz
(74) *Attorney, Agent, or Firm* — Haynes and Boone, LLP

(57) ABSTRACT

A method of fabricating a semiconductor device is disclosed. The method includes forming a first flowable-material (FM) layer over a substrate. A top surface of the first FM layer in a first region is higher than a top surface of the first FM layer in a second region. The method also includes forming a sacrificial plug to cover the first FM layer in the first region, forming a second FM layer over the sacrificial plug in the first region and over the first FM layer in the second region, performing a first recessing process such that the second FM layer is removed in the first region and performing a second recessing process on the second FM layer in the second region while the first FM layer is protected by the sacrificial plug in the first region.

20 Claims, 6 Drawing Sheets

(56) References Cited

U.S. PATENT DOCUMENTS

| | | |
|---|---|---|
| 2011/0281208 A1 | 11/2011 | Lin et al. |
| 2012/0278776 A1 | 11/2012 | Lei et al. |
| 2013/0295769 A1 | 11/2013 | Lin et al. |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |

* cited by examiner

METHOD OF PLANARIZING A FILM LAYER

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For an example, improvements in planarizing a film layer are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
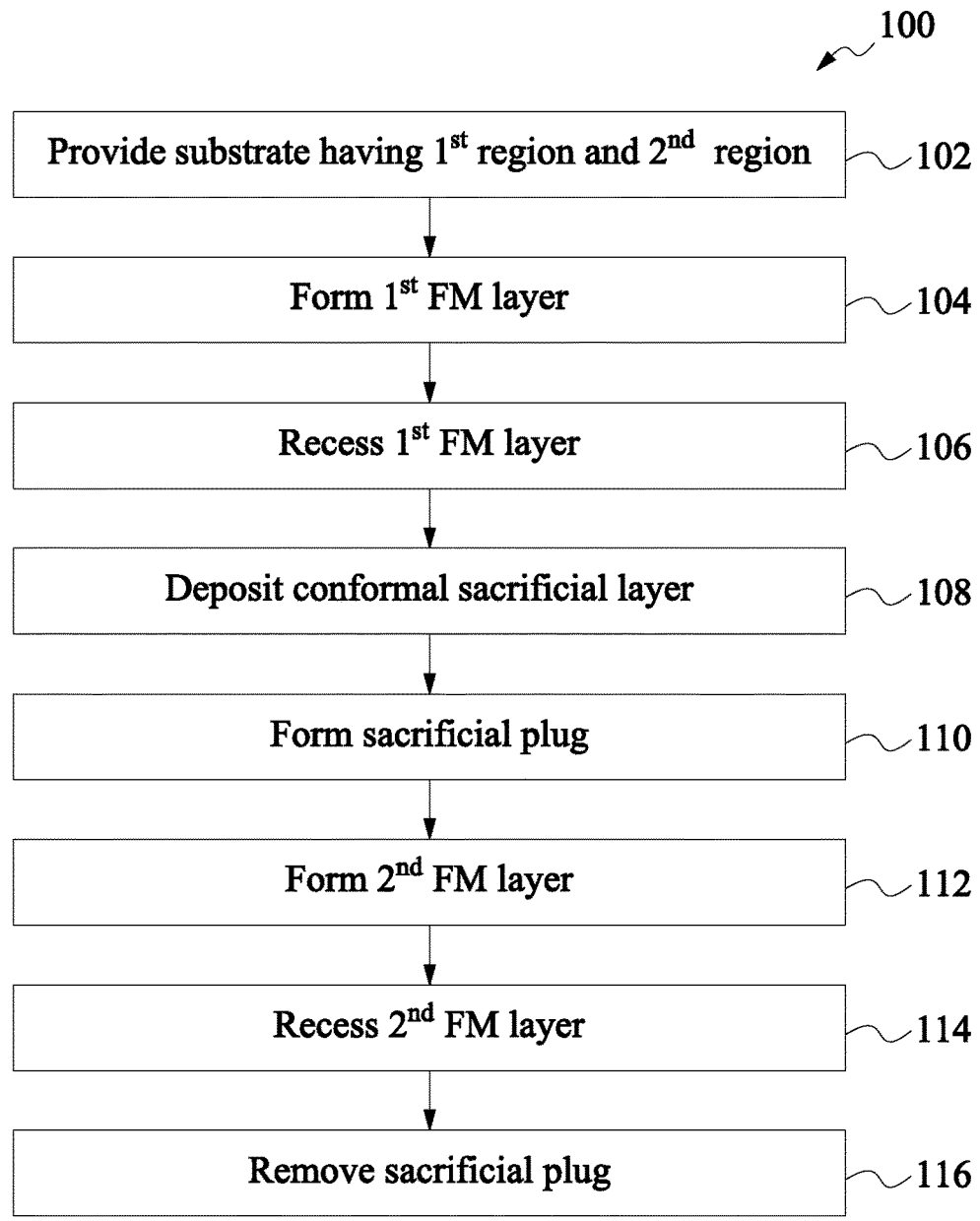
FIG. 1 is a flowchart of an example method for fabricating a semiconductor device constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a semiconductor device 200, shown in FIGS. 2, 3, 4, 5, 6, 7, 8A, 8B, 9A and 9B.

Figure 2:
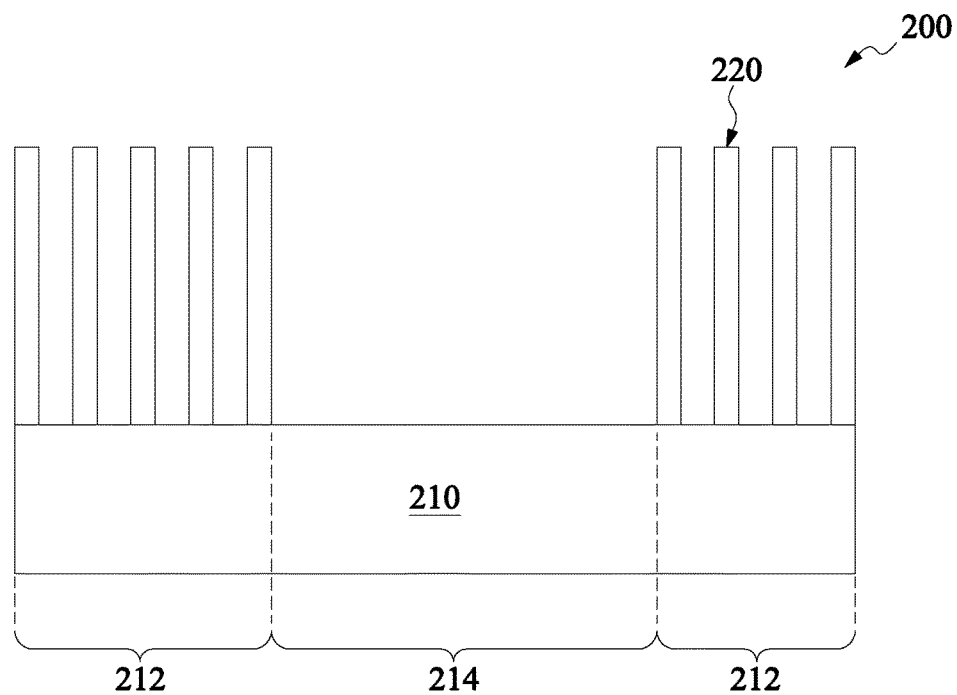
FIGS. 2, 3, 4, 5, 6, 7, 8A, 8B, 9A and 9B are cross-sectional views of an example semiconductor device in accordance with some embodiments.

Referring to FIGS. 1 and 2, the method 100 begins at step 102 by providing a substrate 210 having a plurality of features 220 protruding from the substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation regions. The isolation regions separate various device regions in the substrate 210. The isolation regions include different structures formed by using different processing technologies. For example, the isolation region may include shallow trench isolation (STI) regions. The formation of an STI may include etching a trench in the substrate 210 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include a plurality of inter-level dielectric (ILD) layers such as silicon oxide, silicon nitride, silicon oxynitride, a low-k dielectric, silicon carbide, and/or other suitable layers. The ILD may be deposited by thermal oxidation chemical vapor deposition (CVD), atomic layer deposition (ALD), physical vapor deposition (PVD), thermal oxidation, combinations thereof, or other suitable techniques.

The features 220 may include fin features formed by a procedure including deposition, lithography and etching. The fin features may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The deposition process may include epitaxial growing processes, such as CVD deposition techniques (e.g., vapor-phase epitaxy (VPE) and/or ultra-high vacuum CVD (UHV-CVD)), molecular beam epitaxy, and/or other suitable processes. The lithography process may include coating a resist layer, exposing the resist layer by a lithography exposure process and developing the exposed resist layer. The etching process may include an anisotropic dry etch by using such mechanisms as DRIE (deep reactive-ion etching) with a chlorine-based chemistry. Other dry etchant gasses include $CF_4$, $NF_3$, $SF_6$, and He.

The features 220 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, and/or other suitable techniques. The IL may include oxide, HfSiO and oxynitride and the HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The electrode layer may include Ti, Ag, Al, TiAlN, TaC, TaCN, TaSiN, Mn, Zr, TiN, TaN, Ru, Mo, Al, WN, Cu, W, any suitable materials and/or a combination thereof.

The features 220 may also include source/drain (S/D) features, which include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The S/D features 220 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes.

The features 220 may also include conductive features integrated with the ILD layer in the substrate 210 to form an interconnect structure configured to couple the various p-type and n-type doped regions and the other functional features (such as gate electrodes), resulting a functional integrated circuit. In one example, the features 220 may include a portion of the interconnect structure and the interconnect structure includes a multi-layer interconnect (MLI) structure and an ILD layer over the substrate 210 integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The density of the features 220 varies from one region to another region of the substrate 210. In the present embodiment, the substrate 210 has a first region 212 and a second region 214. A density of the features 220 in the first region 212 is substantial higher than the density in the second region 214. In an embodiment, the density is about 50% in the first region while it is about zero in the second region 214.

Figure 3:
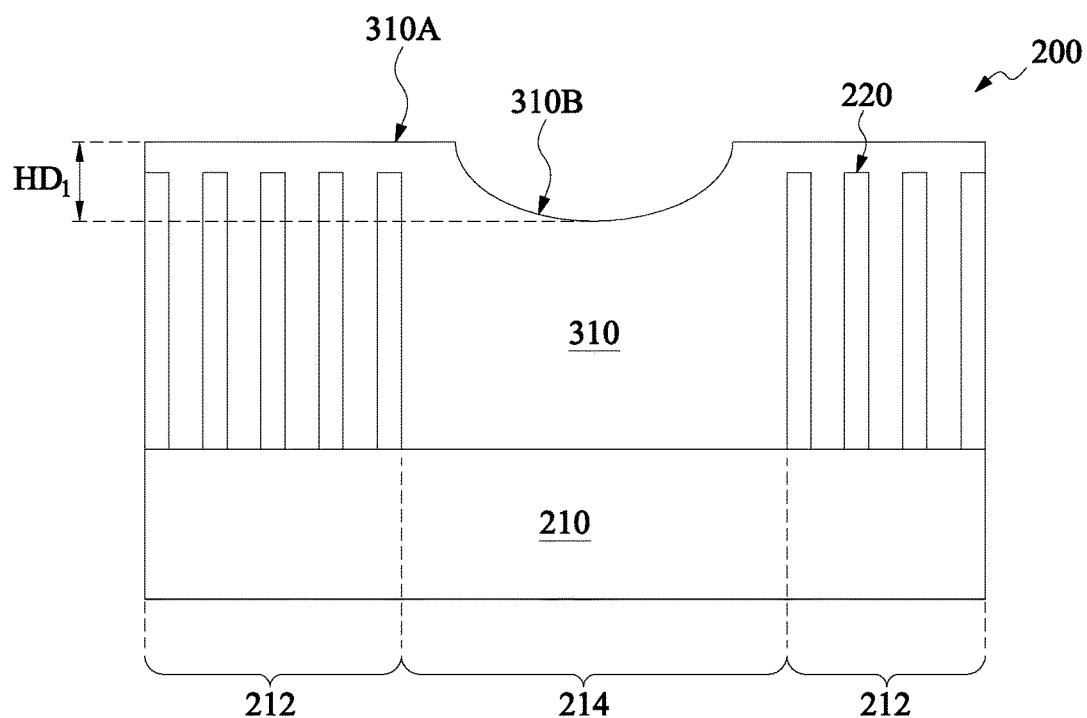

Referring to FIGS. 1 and 3, method 100 proceeds to step 104 by forming a first flowable-material (FM) layer 310 over the substrate 210, including over the features 220. In the first FM layer 310 include a material which fills in spaces between each of features 220 with a flowing nature. The first FM layer 310 may include polyimide, spin-on-glass (SOG), spin-on-polymer (SOP), combinations thereof, and/or other suitable materials. In some embodiment, the first FM layer 310 is different from the features 220 and the substrate 210 to achieve etching selectivity in subsequent etches. The first FM layer 310 may be formed by spin-on coating, CVD, and/or other suitable techniques. Usually the formation process of the first FM layer 310 is a simple low cost deposition process (such as spin-on coating) that is often used during device fabrication.

Typically, topography of the first FM layer 310 after deposition is influenced (or impacted) by the topography of the underlying material layer(s). In the present embodiment, due to different density of features 220 between the first region 212 and the second region 214, it is common that the first FM layer 310 has a non-flat topography (or rugged topography) after it is formed over the substrate 210 having varying densities of the features 220. This is sometimes referred to as coating-loading-effect. In the present embodiment, where the density of features 220 in the first region 212 is higher than the density in the second region 214, a first top surface 310A of the first FM layer 310 in the first region 212 is higher than a second top surface 310B in the second region 214. A first height difference $HD_1$ is defined as a height difference between the highest point of the first top surface 310A and the lowest point of the second top surface 310B.

Figure 4:
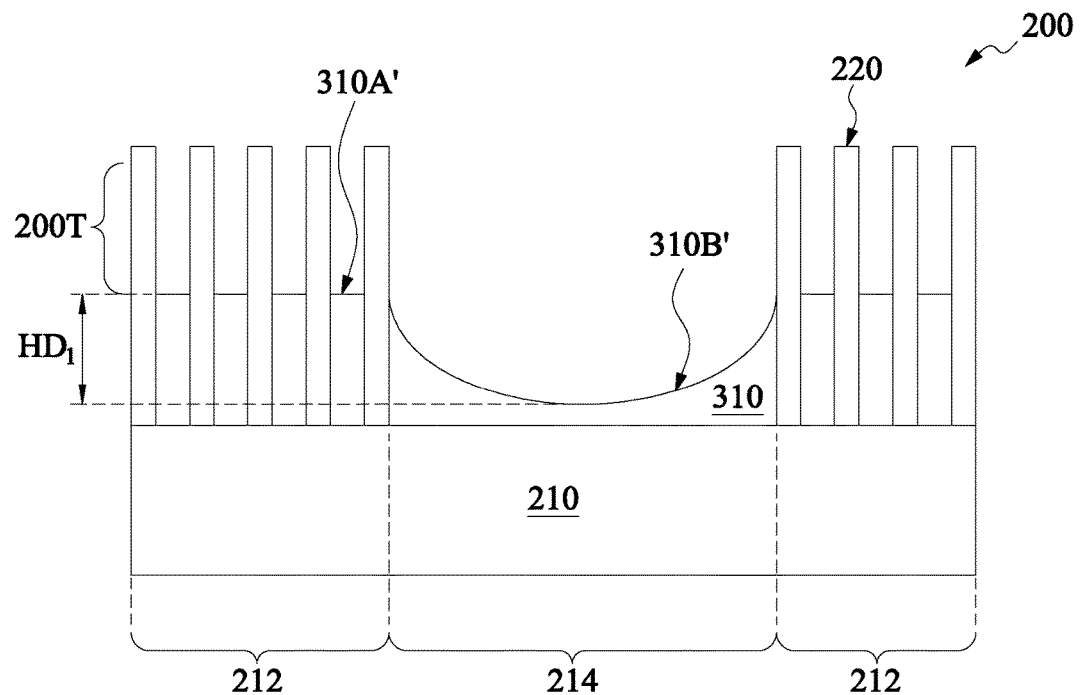

Referring to FIGS. 1 and 4, method proceeds to step 106 by recessing the first FM layer 310 to expose top portions 220T of the features 220. As has been mentioned previously, the etch process is chosen to selectively etch the first FM layer 310 without etching the features 220. The etch process may include a selective wet etch, a selective dry etch, and/or a combination thereof.

After recessing process, the top surfaces 310A and 310B have been reduced to new top surfaces, 310A' and 310B', respectively. Since the first FM layer 310 is etched simultaneously in the first region 212 and the second region 214, the first and second top surfaces are recessed/etched a similar amount. Thus, as a result, a new height difference, between the highest point of the top surface 310A' and the lowest point of the top surface 310B', is substantially similar (or the same) as the first height difference $HD_1$. In other words, the topography of the recessed FM layer 310 remains the same as its topography was before the recessing process. This is typically not desirable for subsequent processes. Accordingly, the present disclosure provides a method that allows for greater reduction/recession of the top surface of the material layer in the first region to improve the overall degree of planarization of the material layer between the first and second regions of the substrate.

Figure 5:
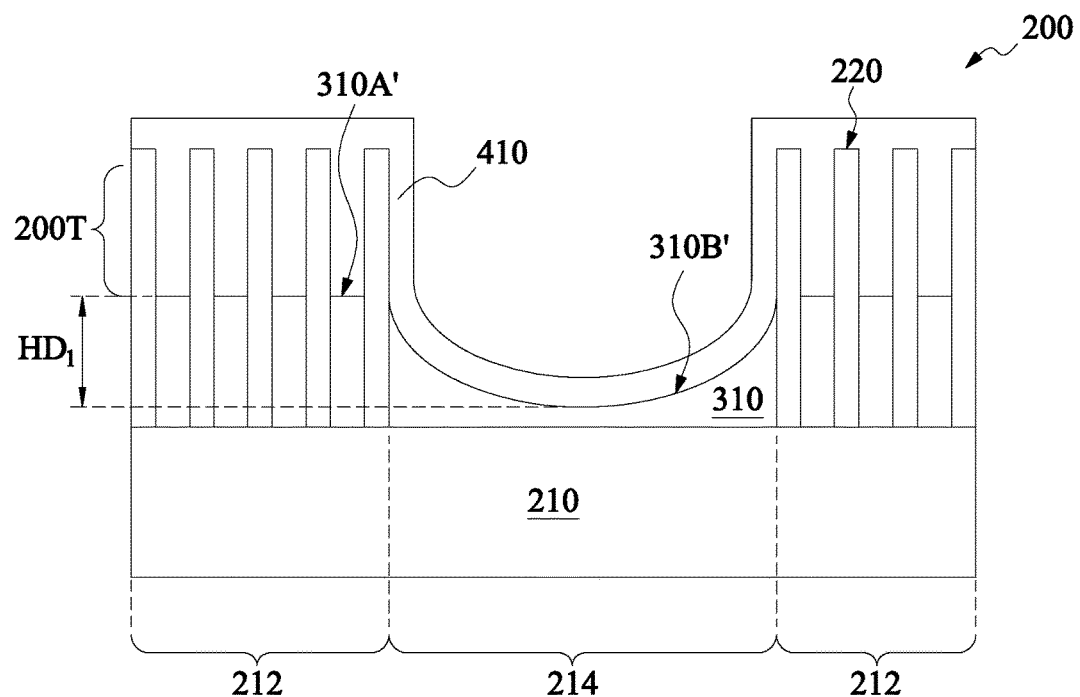

Referring to FIGS. 1 and 5, method 100 proceeds to step 108 by depositing a conformal sacrificial layer 410 over recessed FM layer 310. In the present embodiment, the conformal sacrificial layer 410 is formed such that it fully (or completely) fills in spaces between adjacent top portions 220T of the features 220 in the first region 220. The conformal sacrificial layer 410 may include silicon oxide, silicon nitride, oxynitride, silicon carbide, and/or other suitable materials. The conformal sacrificial layer 410 may be formed by ALD, CVD, PVD, and/or other suitable techniques. In some embodiments, the conformal sacrificial layer 410 includes a material which is different from the features 220 and the first FM layer 310 to achieve etching selectivity in subsequent etches.

Figure 6:
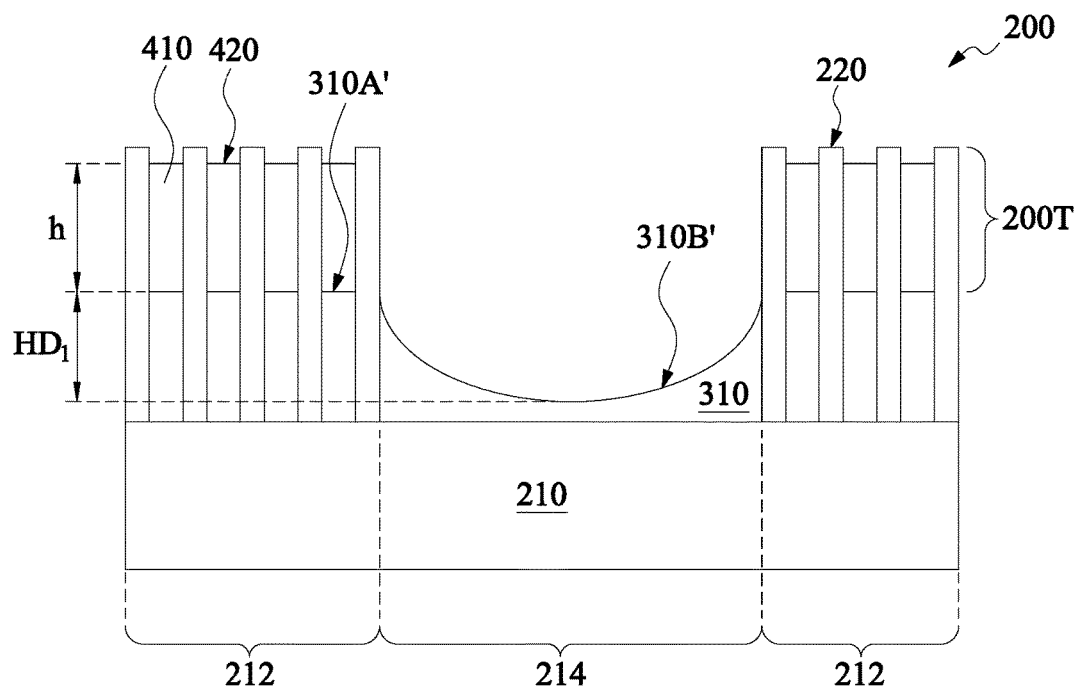

Referring to FIGS. 1 and 6 method 100 proceeds to step 110 by recessing the conformal sacrificial layer 410. In the present embodiment, the recess depth is controlled such that the conformal sacrificial layer 410 is removed from the second region 214 while a portion remains covering (or over) the recessed FM layer 310 between top portions 220T of the features 220 in the first region 212. The portion of conformal sacrificial layer 410 remaining between top portions 220T is referred to as sacrificial plugs 420. The sacrificial plugs 420 are formed with a designed height h for a subsequent planarization process, which will be described later.

As has been mentioned previously, the etch process is chosen to selectively etch the conformal sacrificial layer 410 without etching the top portions 220T of the features 220 and the first FM layer 310. The etch process may include a selective wet etch, a selective dry etch, and/or a combination thereof. As an example, a selective wet etching solution may include $HNO_3$, $NH_4OH$, $KOH$, $HF$, $HCl$, $NaOH$, $H_3PO_4$, TMAH, and/or other suitable selective wet etching solutions, and/or combinations thereof. Alternatively, a selective dry etching process may implement chlorine-containing gas (e.g., $Cl_2$, $CHCl_3$, $CCl_4$, and/or $BCl_3$), bromine-containing gas (e.g. $HBr$ and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof.

Figure 7:
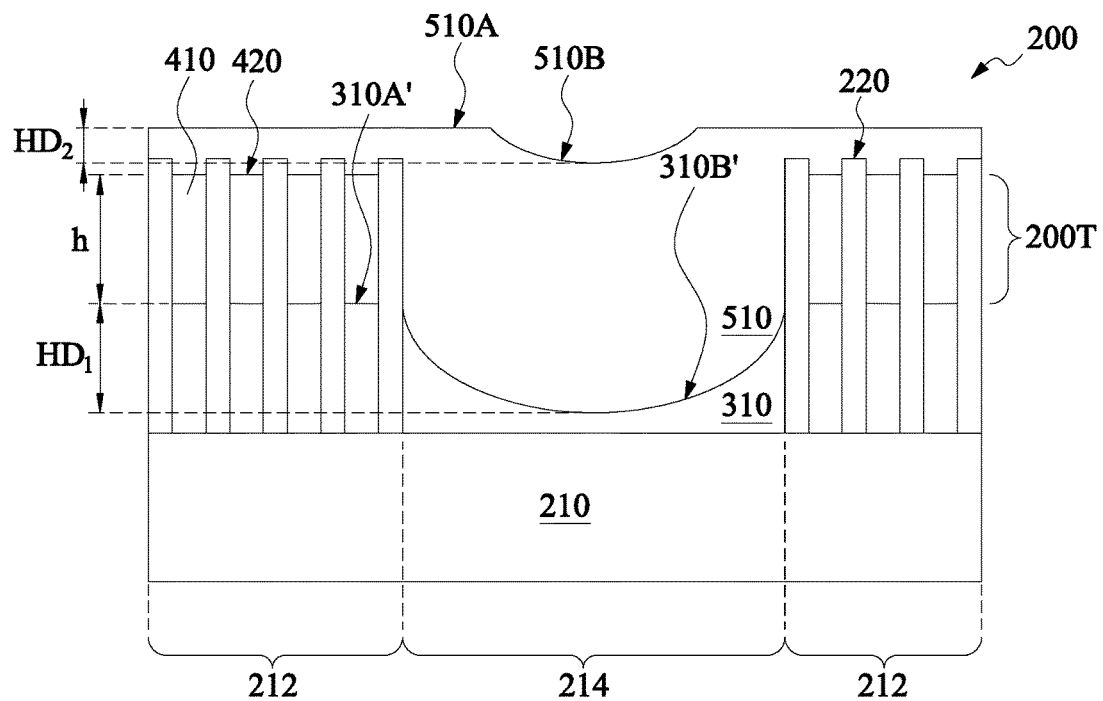

Referring to FIGS. 1 and 7, method 100 proceeds to step 112 by forming a second FM layer 510 over the recessed first FM 310 and the sacrificial plugs 420. In some embodiment, the second FM layer 510 includes a material which is different from the feature 220 and the sacrificial plugs 420 to achieve etching selectivity in subsequent etches. In some embodiments, the second FM layer 510 is formed similarly in many respects to the first FM layer 310 discussed above association with FIG. 3, including the materials discussed therein.

Similarly to the first FM layer 310, due to coating-loading-effect, a third top surface 510A of the second FM layer 510 in the first region 212 is higher than a fourth top surface 510B in the second region 214. A second height difference $HD_2$ is defined as a height difference between the highest point of the third top surface 510A and the lowest point of the fourth top surface 510B. The second height difference $HD_2$ may be smaller than the first height difference $HD_1$ but a further reduction of the second height difference $HD_2$ is desired.

Figure 8A:
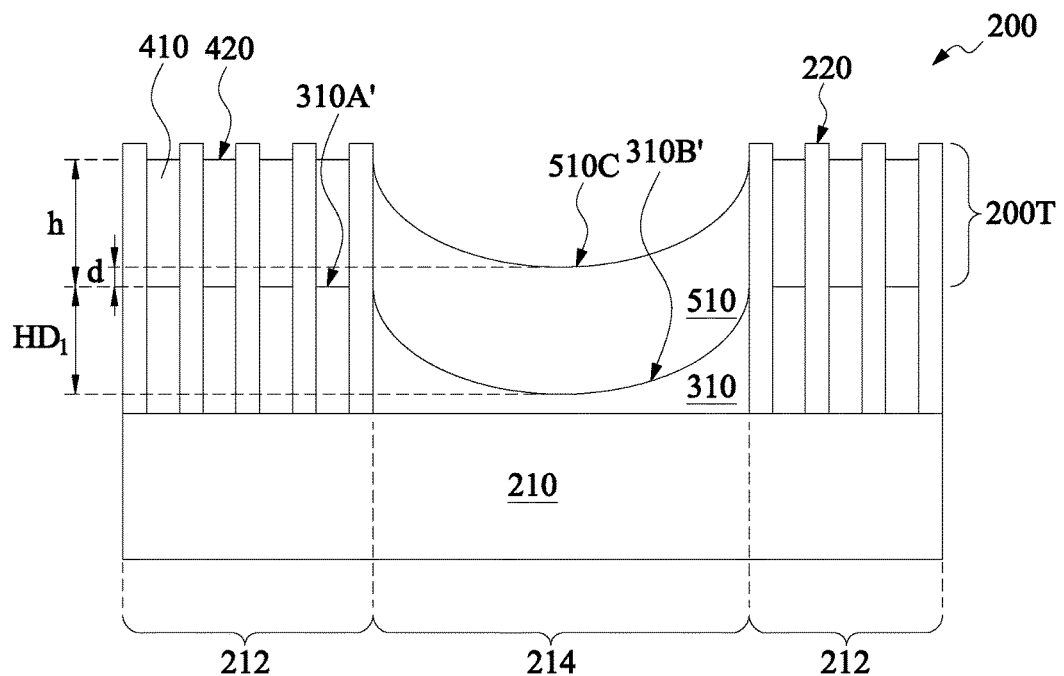
Figure 8B:
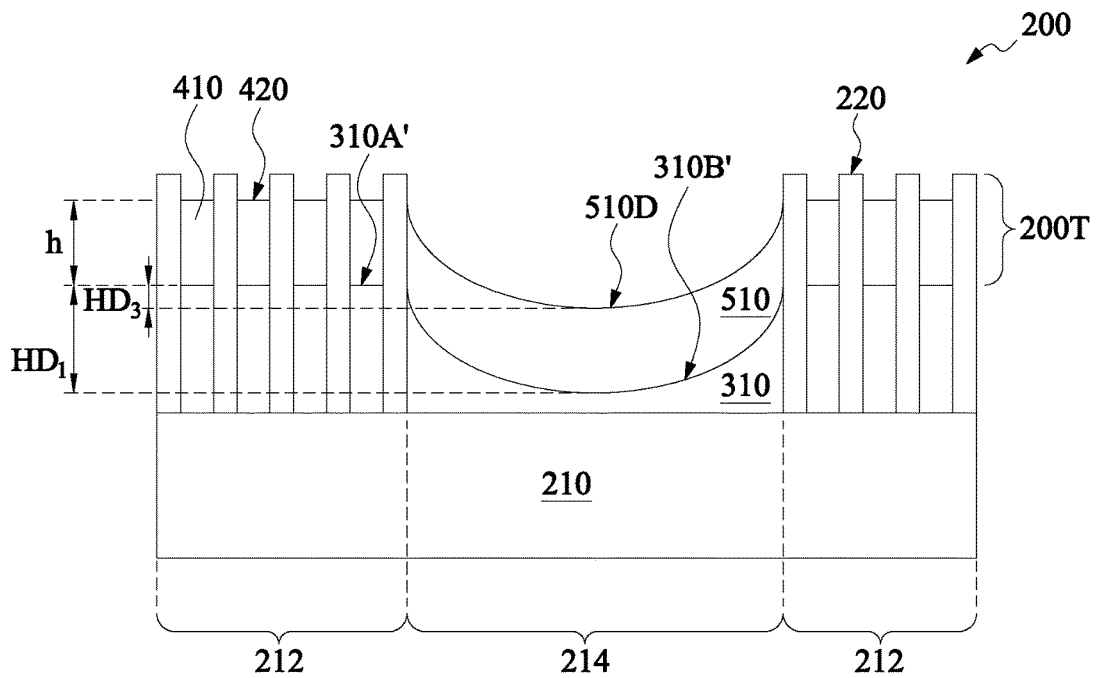

Referring to FIGS. 1, 8A and 8B, method 100 proceeds to step 114 by recessing the second FM layer 510. As has been mentioned previously, the etch process is chosen to selectively etch the second FM layer 510 without etching the features 220 and the sacrificial plugs 520. The etch process may include a selective wet etch, a selective dry etch, and/or a combination thereof.

In the present embodiment, when the second FM layer 510 is removed from the first region 212 while the sacrificial plugs 420 serve as an etch-stop layer such that the first FM layer 310 underneath the sacrificial plugs 420 is protected. The etching also results in the fourth top surface 510B being reduced/recessed to a fifth top surface 510C. Because of the sacrificial plugs 420 protecting the first FM layer 310, the second FM layer 510 can be recessed individually to a designated level. In some embodiments, as has been mentioned above, by choosing the height h of the sacrificial plugs 420, the fifth top surface 510C may be above the first top surface 310A by a distance d, as shown in FIG. 8A. In some embodiments, the second FM layer 510 is recessed further such that the fifth top surface 510C is close to or below the first top surface 310A by a third height difference $HD_3$, as shown in FIG. 8B. The third height difference $HD_3$ is defined as a height difference between the highest point of the first top surface 310A and the lowest point of the fifth top surface 510C.

Figure 9A:
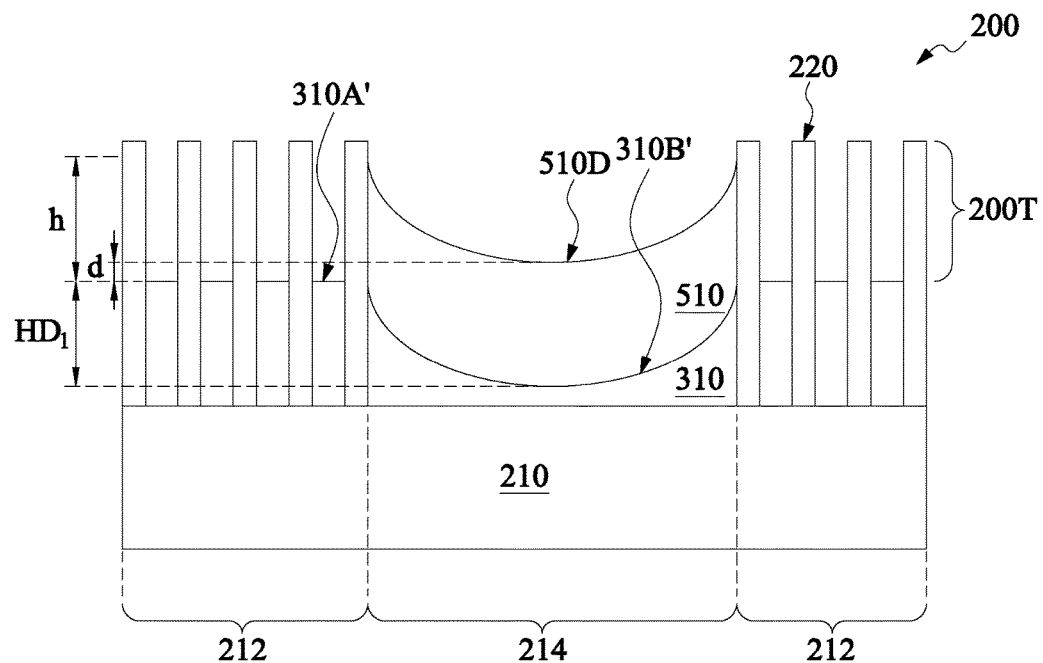
Figure 9B:
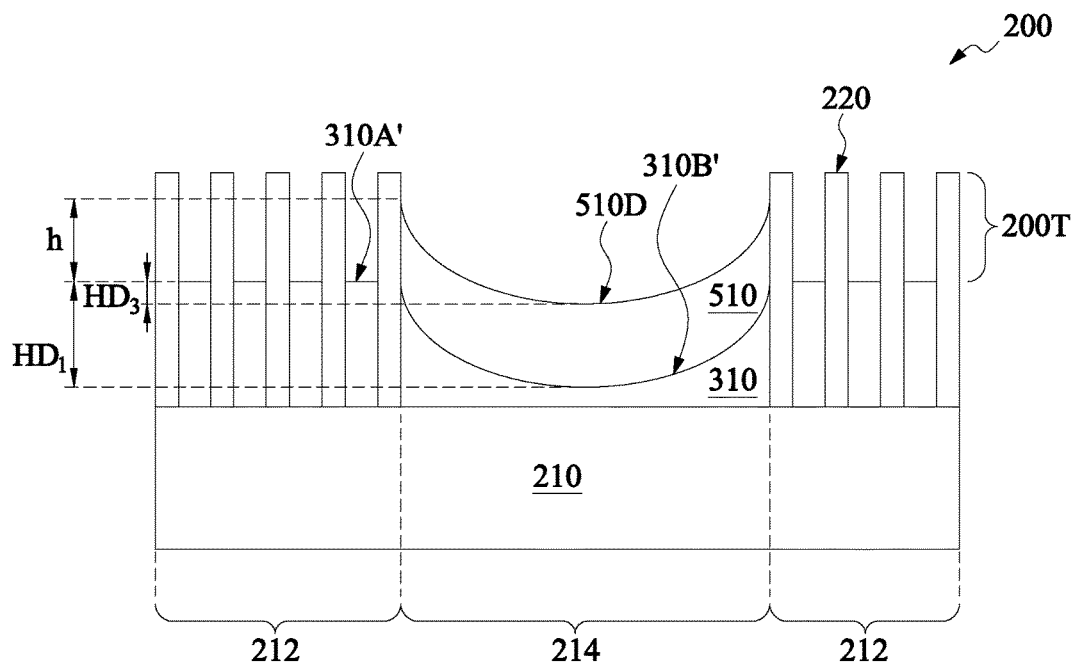

Referring to FIGS. 1, 9A and 9B, method 100 proceeds to step 116 by removing the sacrificial plugs 420. An etching process may include a selective wet etch, a selective dry etch, and/or a combination thereof. As has been mentioned previously, the etch process is chosen to selectively etch the sacrificial plugs 420 without etching the features 220, the first FM layer 310 and the second FM layer 510.

As shown in FIG. 9A, for circumstances where the fifth top surface 510C is above the first top surface 310A (in conjunction with the process described with respect to FIG. 8A), a resultant topography of the FM layer 310 in the first region 212 and the second FM layer 510 in the second region 214 is formed such that a top surface, namely the fifth top surface 510C, in the second region 214 (having a low density of the feature 220) is higher than a top surface, namely the first top surface 310A. In other words, a reversed topography, comparing to original topography, is achieved and this provides flexibility for subsequent processes.

As shown in FIG. 9B, for circumstances where the fifth top surface 510C is close to or below the first top surface 310A (in conjunction with the process described with respect to FIG. 8B), a resultant topography of the FM layer 310 in the first region 212 and the second FM layer 510 in the second region 214 has a more planarized topography such that a third height difference $HD_3$ is much smaller than the first height difference $HD_1$. In an embodiment, the third height difference $HD_3$ is about 10%-60% of the first height difference $HD_1$.

Additional steps can be provided before, during, and after the method 100, and some of the steps described can be replaced or eliminated for other embodiments of the method.

Based on the above, the present disclosure offers methods for planarizing a film layer and reducing coating-loading-effect. The method employs forming sacrificial plugs to achieve individually etching a portion of a film layer to improve planarization of the film layer. The method also employs modulating a height of the sacrificial plug to achieve desired topography from one region to another region. The method demonstrates a feasible, flexible and low cost planarization method for the FM layer.

The present disclosure provides many different embodiments of fabricating a semiconductor device that provide one or more improvements over existing approaches. In one embodiment, a method for fabricating a semiconductor device includes forming a first flowable-material (FM) layer over a substrate. The substrate has a first region and a second region. A top surface of the first FM layer in the first region is higher than a top surface of the first FM layer in the second region. The method also includes forming a sacrificial plug to cover the first FM layer in the first region, forming a second FM layer over the sacrificial plug in the first region and over the first FM layer in the second region, performing a first recessing process such that the second FM layer is removed in the first region and performing a second recessing process on the second FM layer in the second region while the first FM layer is protected by the sacrificial plug in the first region.

In another embodiment, a method includes providing a substrate having a plurality of features protruding from the substrate in a first region of the substrate and forming a first flowable-material (FM) layer over the plurality of features in the first region and over the substrate in a second region of the substrate. A top surface of the first FM layer in the first region is higher than a top surface of the first FM layer in the second region. The method also includes forming a sacrificial plug over the first FM layer in the first region, forming a second FM layer over the sacrificial plug in the first region and the first FM layer in the second region, removing a first portion of the second FM layer from the first region and removing a second portion of the second FM layer in the second region while the first FM layer is protected by the sacrificial plug in the first region.

In yet another embodiment, a method includes providing a substrate having a first region and a second region. The first region includes a plurality of protruding features. The method also includes forming a first flowable-material (FM) layer over the plurality of protruding features. A top surface of the first FM layer in the first region is higher than a top surface of the first FM layer in the second region. The method also includes forming a sacrificial plug over the first FM layer in the first region, forming a second FM layer over the sacrificial plug in the first region and over the first FM layer in the second region and recessing the second FM layer such that the second FM layer is removed from the first region and a top surface of the recessed second FM layer in the second region is above a top surface of the first FM layer in the first region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first flowable-material (FM) layer over a substrate, the substrate having a first region and a second region, wherein a top surface of the first FM layer in the first region is higher than a top surface of the first FM layer in the second region;
   forming a sacrificial plug to cover the first FM layer in the first region, including:
      forming a sacrificial layer over the first FM layer, and recessing the sacrificial layer such that the sacrificial layer in the second region is removed and a portion of the sacrificial layer remains in the first region;
   forming a second FM layer over the sacrificial plug in the first region and over the first FM layer in the second region;
   performing a first recessing process such that the second FM layer is removed in the first region; and
   performing a second recessing process on the second FM layer in the second region while the first FM layer is protected by the sacrificial plug in the first region.

2. The method of claim 1, wherein the sacrificial layer is conformal.

3. The method of claim 1, wherein after performing the second recessing process on the second FM layer in the second region, a top surface of the remaining second FM layer in the second region is at about the same level of a top surface of the first FM layer in the first region.

4. The method of claim 1, further comprising removing the sacrificial plug after performing the second recessing process on the second FM layer in the second region.

5. The method of claim 1, further comprising forming a plurality of features over the substrate in the first region, and wherein forming the first FM layer over the substrate includes forming the first FM layer between each feature from the plurality of features.

6. The method of claim 5, wherein forming the first FM layer between each feature from the plurality of features includes:
   forming the first FM layer over the plurality of features; and
   recessing the first FM layer.

7. The method of claim 5, wherein forming the sacrificial plug to cover the first FM layer in the first region includes forming the sacrificial plug over the first FM layer between each feature from the plurality of features.

8. The method of claim 1, wherein a top surface of the recessed second FM layer in the second region is above a top surface of the first FM layer in the first region, after performing the second recessing process on the second FM layer in the second region.

9. The method of claim 1, further comprising removing a portion of the sacrificial plug in the first region prior to forming the second FM layer over the sacrificial plug in the first region and over the first FM layer in the second region.

10. A method comprising:
    providing a substrate having a plurality of features protruding from the substrate in a first region of the substrate;
    forming a first flowable-material (FM) layer over the plurality of features in the first region and over the substrate in a second region of the substrate, wherein a top surface of the first FM layer in the first region is higher than a top surface of the first FM layer in the second region, wherein the forming the first FM layer over the plurality of features in the first region includes recessing the first FM layer to expose upper portions of the plurality of features;
    forming a sacrificial plug over the first FM layer in the first region;
    forming a second FM layer over the sacrificial plug in the first region and the first FM layer in the second region;
    removing a first portion of the second FM layer from the first region; and
    removing a second portion of the second FM layer in the second region while the first FM layer is protected by the sacrificial plug in the first region.

11. The method of claim 10, wherein forming the sacrificial plug over the first FM layer in the first region includes:
    forming a conformal sacrificial layer over the first FM layer; and
    recessing the conformal sacrificial layer such that the conformal sacrificial layer in the second region is removed and a portion of the conformal sacrificial layer remains over the first FM layer in the first region.

12. The method of claim 10, wherein a top surface of the second FM layer in the second region is above a top surface of the first FM layer in the first region after removing the second portion of the second FM layer in the second region while the first FM layer is protected by the sacrificial plug in the first region.

13. The method of claim 10, wherein the plurality of features includes at least one semiconductor fin structure.

14. The method of claim 10, further comprising removing the sacrificial plug after removing the second portion of the second FM layer in the second region while the first FM layer is protected by the sacrificial plug in the first region.

15. A method comprising:
providing a substrate having a first region and a second region, wherein the first region includes a plurality of protruding features;
forming a first flowable-material (FM) layer over the plurality of protruding features, wherein a top surface of the first FM layer in the first region is higher than a top surface of the first FM layer in the second region;
forming a sacrificial plug over the first FM layer in the first region, wherein the sacrificial plug is in direct contact with a portion of the plurality of protruding features;
forming a second FM layer over the sacrificial plug in the first region and over the first FM layer in the second region; and
recessing the second FM layer such that the second FM layer is removed from the first region and a top surface of the recessed second FM layer in the second region is above a top surface of the first FM layer in the first region.

16. The method of claim 15, wherein forming the first FM layer over the plurality of protruding features includes recessing the first FM layer to expose upper portions of the plurality of protruding features.

17. The method of claim 16, wherein recessing the first FM layer and recessing the second FM layer include an etching process, wherein the etching process is chosen such that the first and second FM layers are recessed without substantially recessing the plurality of protruding features.

18. The method of claim 15, wherein forming the sacrificial plug over the first FM layer in the first region includes:
forming a conformal sacrificial layer over the first FM layer; and
recessing the conformal sacrificial layer such that the conformal sacrificial layer in the second region is removed and a portion of the conformal sacrificial layer remains over the first FM layer in the first region.

19. The method of claim 15, further comprising recessing the recessed second FM layer in the second region while the first FM layer is protected by the sacrificial plug.

20. The method of claim 15, further comprising removing the sacrificial plug.

* * * * *